(12) United States Patent
Foong et al.

(10) Patent No.: US 6,900,531 B2
(45) Date of Patent: May 31, 2005

(54) IMAGE SENSOR DEVICE (75) Inventors: Chee Seng Foong, Sungai Buloh (MY); Kok Wai Mui, Petaling Jaya (MY); Kim Heng Tan, Singapore (SG); Lan Chu Tan, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/280,952

(22) Filed: Oct. 25, 2002

(65) Prior Publication Data

US 2004/0080037 A1 Apr. 29, 2004

(51) Int. Cl.⁷ .............................................. H01L 23/22
(52) U.S. Cl. .................... 257/687; 257/99; 257/100; 257/787; 257/790
(58) Field of Search ............................. 257/95, 96, 97, 257/98, 99, 100, 737, 738, 687, 704, 705, 787, 790, 794, 701, 702, 709, 86, 87, 88, 91, 94

(56) References Cited

U.S. PATENT DOCUMENTS

| | | | |
|---|---|---|---|
| 5,107,328 A | | 4/1992 | Kinsman |
| 5,950,074 A | | 9/1999 | Glenn et al. |
| 6,034,429 A | | 3/2000 | Glenn et al. |
| 6,117,705 A | | 9/2000 | Glenn et al. |
| 6,121,675 A | | 9/2000 | Fukamura et al. |
| 6,143,588 A | | 11/2000 | Glenn |
| 6,266,197 B1 | * | 7/2001 | Glenn et al. |
| 6,268,231 B1 | | 7/2001 | Wetzel |
| 6,268,654 B1 | | 7/2001 | Glenn et al. |
| 6,274,927 B1 | * | 8/2001 | Glenn |
| 6,285,064 B1 | | 9/2001 | Foster |
| 6,342,406 B1 | | 1/2002 | Glenn et al. |
| 6,384,472 B1 | | 5/2002 | Huang |
| 6,395,582 B1 | * | 5/2002 | Sohn et al. |
| 6,410,981 B2 | * | 6/2002 | Tao |
| 6,410,987 B1 | * | 6/2002 | Kanemoto et al. |
| 2001/0014486 A1 | | 8/2001 | Glenn |
| 2001/0034083 A1 | | 10/2001 | Coyle et al. |
| 2002/0060084 A1 | * | 5/2002 | Hilton et al. ............... 174/52.1 |
| 2003/0222333 A1 | * | 12/2003 | Bolken et al. ............... 257/678 |

FOREIGN PATENT DOCUMENTS

| | | |
|---|---|---|
| EP | 0 425 776 A1 | 5/1991 |
| EP | 1 251 566 A1 | 10/2002 |
| WO | WO 01/15237 A1 | 3/2001 |

OTHER PUBLICATIONS

PCT International Seaarch Report.

* cited by examiner

Primary Examiner—Long Pham
Assistant Examiner—Dilinh Nguyen
(74) Attorney, Agent, or Firm—Charles E. Bergere (57) ABSTRACT An image sensor device is made using an ultra-thin substrate so that the overall device height is less than 1.0 mm. The image sensor includes a flexible circuit substrate having first and second opposing sides, the first side having a central area and an outer, bonding pad area including bonding pads. A sensor integrated circuit (IC) is attached to the central area of the first side of the circuit substrate. The IC has an active area and a peripheral bonding pad area including bonding pads. Wires are wirebonded to respective ones of the IC bonding pads and corresponding ones of the circuit substrate bonding pads to electrically connect the IC and the circuit substrate. A wall having a first end with a step and a second end has its second end attached to an outer portion beyond the outer bonding pad area of the first side of the flexible circuit substrate. The wall at least partially surrounds the sensor integrated circuit. A transparent cover is located above the IC such that light can pass through the cover onto the IC active area. Opposing edges of the cover are secured within the step of the wall. Solder balls are attached to the second side of the circuit substrate. The circuit substrate provides for electrical interconnect between the solder balls and the bonding pads on the first side of the circuit substrate.

16 Claims, 5 Drawing Sheets

IMAGE SENSOR DEVICE

BACKGROUND OF THE INVENTION

The present invention relates generally to the packaging of electrical components, and more particularly, to a method of packaging an imaging sensing circuit.

There has been a constant demand for smaller and smarter industrial and consumer electronic products such as digital cameras, camcorders, audio players, etc. Such miniaturization and increased functionality has benefited from advances in the design and manufacturing of semiconductor circuits and wafers. There has also been a marked increase in the use of optical and image sensors in electronic products. At present, all of the available optical and image sensors are packaged in conventional, rigid base carriers such as ceramics or organic substrates. Rigid organic substrates are generally made from BT (bismaleimide-triazine) resin, ceramics, or FR-4.

For example, U.S. Pat. No. 6,268,231 discloses a CCD package having a plastic base structure, a flexible plastic circuit board mounted on the base structure, a plastic rim mounted on the circuit board, a CCD sensor mounted on the circuit board and inside the rim, and a glass cover mounted on the rim. The CCD sensor is wire bonded to the circuit board. The plastic base structure, circuit board and rim, not to mention the glass cover, make for a relatively thick package. U.S. Pat. Nos. 6,034,429, 6,268,654 and 6,143,588 also disclose a CCD package including an IC die mounted on and wire bonded to a first side of a BT substrate, a bead or dam formed in varying manners around the IC die, a glass lid attached to the bead, and solder balls attached to a second side of the BT substrate. All of these packages are relatively thick. Thus, although the package size of image sensors has decreased, there is still room for improvement, as lower cost and smaller package footprint and height are critical in assuring that more intelligence and functionality are incorporated into new electronic devices.

BRIEF DESCRIPTION OF THE DRAWINGS

The foregoing summary, as well as the following detailed description of the present invention, will be better understood when read in conjunction with the appended drawings. For the purpose of illustrating the invention, there is shown in the drawings embodiments that are presently preferred. It should be understood, however, that the invention is not limited to the precise arrangement and instrumentalities shown. In the drawings.

DETAILED DESCRIPTION OF PREFERRED EMBODIMENTS

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

The present invention provides an image sensor device made using an ultra-thin substrate so that the overall device height is less than about 1.0 mm. In one embodiment, the present invention provides an image sensor including a flexible circuit substrate having first and second opposing sides, the first side having a central area and an outer, bonding pad area including bonding pads. A sensor integrated circuit (IC) is attached to the central area of the first side of the circuit substrate. The IC has an active area and a peripheral bonding pad area including bonding pads. Wires are wirebonded to respective ones of the IC bonding pads and corresponding ones of the circuit substrate bonding pads to electrically connect the IC and the circuit substrate. A wall having a first end with a step and a second end has its second end attached to an outer portion beyond the outer bonding pad area of the first side of the flexible circuit substrate. The wall at least partially surrounds the sensor integrated circuit. A transparent cover is located above the IC such that light can pass through the cover onto the IC active area. Opposing edges of the cover are secured within the step of the wall. Solder balls are attached to the second side of the circuit substrate. The circuit substrate provides for electrical interconnect between the solder balls and the bonding pads on the first side of the circuit substrate.

In another embodiment, the present invention provides an image sensor device including a flexible circuit substrate having first and second opposing sides, the first side having a central area and an outer, bonding pad area including bonding pads. A sensor integrated circuit (IC) is attached to the central area of the first side of the circuit substrate. The IC has an active area and a peripheral bonding pad area including bonding pads. A plurality of wires are wirebonded to respective ones of the IC bonding pads and corresponding ones of the circuit substrate bonding pads, thereby electrically connecting the IC and the circuit substrate. A wall is attached to an outer portion beyond the outer bonding pad area of the first side of the flexible circuit substrate. The wall at least partially surrounds the sensor integrated circuit. A transparent cover is disposed above the sensor integrated circuit such that light can pass through the cover onto the IC active area. The circuit substrate includes a polyimide layer having top and bottom surfaces, and a thickness of about 50 um, an adhesive layer having a thickness of about 12 um overlying the top surface of the polyimide layer, a conductive trace layer having a thickness of between about 12 um to about 30 um overlying the adhesive layer, and a mask layer having a thickness of about 30 um overlying the conductive trace layer. A top surface of the mask layer forms the first side of the circuit substrate and the bottom surface of the polyimide layer forms the second side of the circuit substrate.

In yet another embodiment, the present invention provides a method of making an image sensor device, comprising the steps of:

providing a multi-layer circuit substrate including a polyimide layer having a thickness of about 50 um, an adhesive layer having a thickness of about 12 um overlying a first side of the polyimide layer, a conductive metal trace layer having a thickness of between about 12 um to about 30 um overlying the adhesive layer, and a solder mask layer having a thickness of about 30 um overlying the conductive metal trace layer;

forming a wall along an outer perimeter of the circuit substrate;

attaching a sensor integrated circuit (IC) to the circuit substrate within the walls, wherein the IC has an central active area and a peripheral bonding pad area including bonding pads;

electrically connecting wires to the bonding pads of the IC and corresponding bonding pads of the circuit substrate via wirebonding;

attaching a transparent cover to the wall such that the cover is over the IC, whereby light may pass through the cover onto the IC active area; and attaching solder balls to a second side of the polyimide layer opposing the first side, wherein the circuit substrate provides for electrical interconnect between the solder balls and the wires, and wherein the image sensor device has a height of less than about 1.3 mm.

In a further embodiment, the present invention provides a method of making a plurality of image sensor devices, comprising the steps of:

providing a multi-layer circuit substrate including a polyimide layer having a thickness of about 50 um, an adhesive layer having a thickness of about 12 um overlying a first side of the polyimide layer, a conductive metal trace layer having a thickness of between about 12 um to about 30 um overlying the adhesive layer, and a solder mask layer having a thickness of about 30 um overlying the conductive metal trace layer;

attaching a plurality of sensor integrated circuits to the circuit substrate at spaced intervals, wherein each of the integrated circuits has a central active area and a peripheral bonding pad area including bonding pads;

electrically connecting wires to the bonding pads of the integrated circuits and corresponding bonding pads of the circuit substrate via wirebonding;

forming walls on the circuit substrate around each of the integrated circuits;

attaching a transparent cover to the walls such that the cover extends over all of the integrated circuits, wherein light may pass through the cover onto the integrated circuits active areas;

attaching solder balls to a second side of the polyimide layer opposing the first side, wherein the circuit substrate provides for electrical interconnect between the solder balls and the wires; and singulating the covered integrated circuits at the walls, thereby forming individual image sensor devices, wherein the image sensor devices have a height of less than about 1.3 mm.

Figure 1:
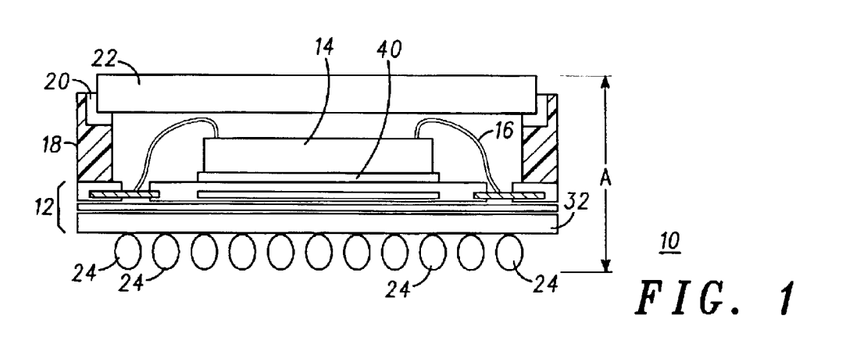
FIG. 1 is an enlarged, cross-sectional view of an optical sensor device in accordance with a first embodiment of the present invention.

Referring now to FIG. 1, an enlarged, cross-sectional view of an optical sensor device 10 in accordance with the present invention is shown. The image sensor device 10 includes a flexible circuit substrate 12, a sensor integrated circuit (IC) 14 attached to the circuit substrate 12, a plurality of wires 16 that electrically connect the IC 14 to the substrate 12, a wall 18 having a step or notch 20 formed in an outer end thereof, and a transparent cover 22 located above the sensor IC 14. The edges of the cover 22 are secured within the step 20 of the wall 18, for example, with an adhesive. The image sensor device 10 further has solder balls 24 attached to a bottom or underside of the circuit substrate 12. The circuit substrate 12 provides for electrical interconnect between the solder balls 24 and IC 14. The solder balls 24 allow the sensor device 10 to be connected to other electrical devices and circuits (not shown).

Figure 2:
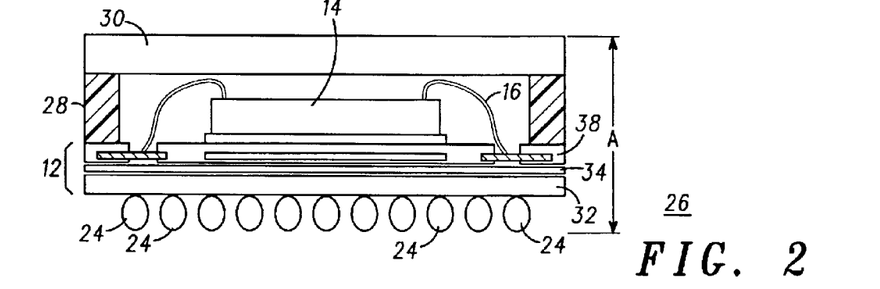
FIG. 2 is an enlarged, cross-sectional view of an optical sensor device in accordance with a second embodiment of the present invention.

Referring now to FIG. 2, an enlarged, cross-sectional view of an optical sensor device 26 in accordance a second embodiment of the present invention is shown. The sensor device 26 includes the flexible circuit substrate 12, the sensor integrated circuit (IC) 14 attached to the circuit substrate 12, the plurality of wires 16 that electrically connect the IC 14 to the substrate 12, a wall 28 formed on the substrate 12 that surrounds the IC 14, and a transparent cover 30 located above the sensor IC 14. The cover 30 is secured to a top side of the wall 28, preferably with an adhesive. The image sensor device 26 further has solder balls 24 attached to a bottom or underside of the circuit substrate 12. The circuit substrate 12 provides for electrical interconnect between the solder balls 24 and IC 14. The solder balls 24 allow the sensor device 10 to be connected to other electrical devices and circuits (not shown). The sensor devices 10 and 26 have a very low profile because the substrate 12 is very thin.

Figure 3:
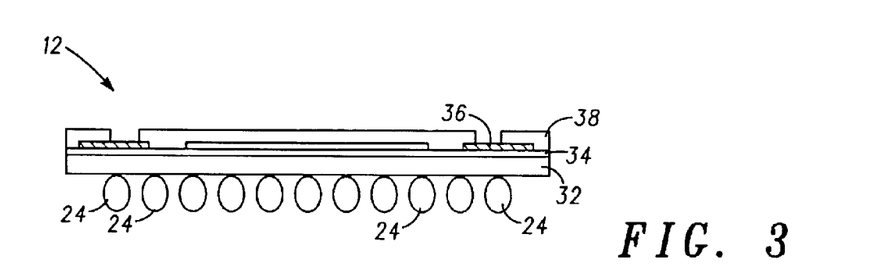
FIG. 3 is an enlarged, cross-sectional view of a substrate of the image sensor device of the present invention.

Referring now to FIG. 3, an enlarged, cross-sectional view of the circuit substrate 12 is shown. The circuit substrate 12 includes a polyimide layer 32 having top and bottom surfaces. An adhesive layer 34 overlies the top surface of the polyimide layer 32, and a conductive trace layer 36 overlies the adhesive layer 34. A solder mask layer 38 overlies the conductive trace layer 36 for protection. A top surface of the mask layer 38 forms the first side of the circuit substrate 12 and the bottom surface of the polyimide layer 32 forms the second side of the circuit substrate 12. As will be understood by those of skill in the art, the circuit substrate 12 provides an electrical interconnect layer for routing signals. However, as opposed to the interconnect layer used in prior art devices, the substrate 12 is very thin.

The polyimide layer 32 has a thickness of about 50 um and preferably less. The adhesive layer 34 has a thickness of about 12 um. The conductive layer 36, which may be formed of a conductive material, such as a conductive metal like copper, has a thickness of between about 12 um to about 30 um. As will be understood by those of skill in the art, the conductive layer 36 forms electrical distribution paths. Finally, the solder mask layer 38 has thickness of about 30 um. Depending on the applications, the substrate 12 may include a layer of metallic interposer (not shown) that acts as a stiffener that is about 150 um thick.

Referring again to FIGS. 1 and 2, the substrate 12 has first and second opposing sides. The first side has a central area and an outer, bonding pad area including bonding pads. The IC 14 is attached to the central area of the first side of the circuit substrate 12, preferably with an adhesive layer 40 having a thickness of about 12 um. The IC 14 has an active area and a peripheral bonding pad area. The peripheral bonding pad area includes bonding pads that are electrically connected to the substrate bonding pads with the wires 16 via wirebonding. Wirebonding is generally accepted to mean the interconnection, via wire, of chips and substrates. The most frequently used methods of joining the wires to the pads are thermosonic and ultrasonic bonding. Ultrasonic wirebonding uses a combination of vibration and force to rub the interface between the wire and the bond pad, causing a localized temperature rise that promotes the diffusion of molecules across the boundary. Thermosonic bonding, in addition to vibration, uses heat, which further encourages the migration of materials. The various types of wirebonding are well known by those of skill in the art. The wires 16 may be formed of any electrically conductive metal or combination of metals, such as are known by those of skill in the art. Suitable bond wires typically comprise copper or gold and may be either fine wires (<50 um in diameter) or heavy wires (>50 um in diameter).

The IC 14 is of a type known to those of skill in the art, and may comprise, for example, a Charge Coupled Device (CCD), a CMOS image sensor, or even a memory device like an EPROM, etc. The active area receives radiation that passes through the transparent cover 22 and converts the radiation to a digital signal. As previously discussed, the IC 14 is preferably attached to the substrate 12 with an adhesive 40. An underfill (not shown) may be disposed between the IC 14 and the substrate 12 to strengthen the device 10.

Referring to FIG. 1, the wall 18 of the device 10 is formed on the surface of the substrate 12 and at least partially surrounds the IC 14 and the wires 16. In the preferred embodiment, the wall 18 completely surrounds the IC 14 and the wires 16. The wall 18 extends upwards from the surface of the substrate 12. The wall 18 has a first end with a step 20 and a second end, which is attached to an outer portion, beyond the outer bonding pad area, of the first side of the substrate 12. The wall 18 is preferably formed of a hard or stiff material, such as a metal or BT, that is strong enough to support the cover 22. The transparent cover 22 is located above the sensor integrated circuit 14 and has its opposing edges secured within the step 20 of the wall 18, preferably with a clear expoxy. The cover 22 allows light to pass therethrough onto the active area of the IC 14. The cover 22 is formed of a transparent material that allows light or radiation to pass therethrough and in order to provide a thin device, the cover 22 should be relatively thin, yet at the same time, should be formed with a relatively stiff material. In the presently preferred embodiment, the cover 22 comprises borosilicate glass having a thickness of about 0.4 mm. However, it will be understood by those of skill in the art that other materials that allow radiation to pass therethrough and can be made thin may also be used. The cover 22 may be treated with an anti-reflective coating and an IR block.

Referring to FIG. 2, the wall 28 of the device 26 is similar to the wall 18 of the device 10 shown in FIG. 1 except that the wall 28 does not include the steps 20 for receiving the cover 22. Rather, a cover 30 that is longer than the cover 22 is attached to the top surface of the wall 28 in a conventional manner. The cover 30, like the cover 22 preferably comprises borosilicate glass having a thickness of about 0.4 mm.

Figure 8:
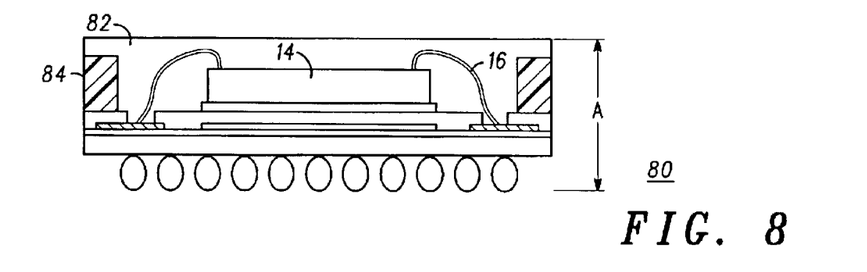

Referring to FIG. 8, a transparent cover 50 is shown in which the edges thereof have been etched to form channels 52. When the cover 50 is attached to the walls 28 of the device 26 shown in FIG. 2, the walls 28 are received within the channels 52 so that the device has a lower profile. It is noted that the cover 50 shown in FIG. 8 is sized for two devices prior to singulation. Thus, the center channel 52 has a double width.

Referring again to FIGS. 1 and 2, the image sensor devices 10 and 26 have solder balls 24 attached to a bottom or underside of the circuit substrate 12. The solder balls have a height of less than about 400 um. By using a very thin substrate 12, the final device 10, 26 has a very low profile. The thickness of the device, as shown by A, is in the range from about 0.9 mm to about 1.3 mm. The preferred device has a thickness of less than 1.0 mm.

Figures 4, 5:
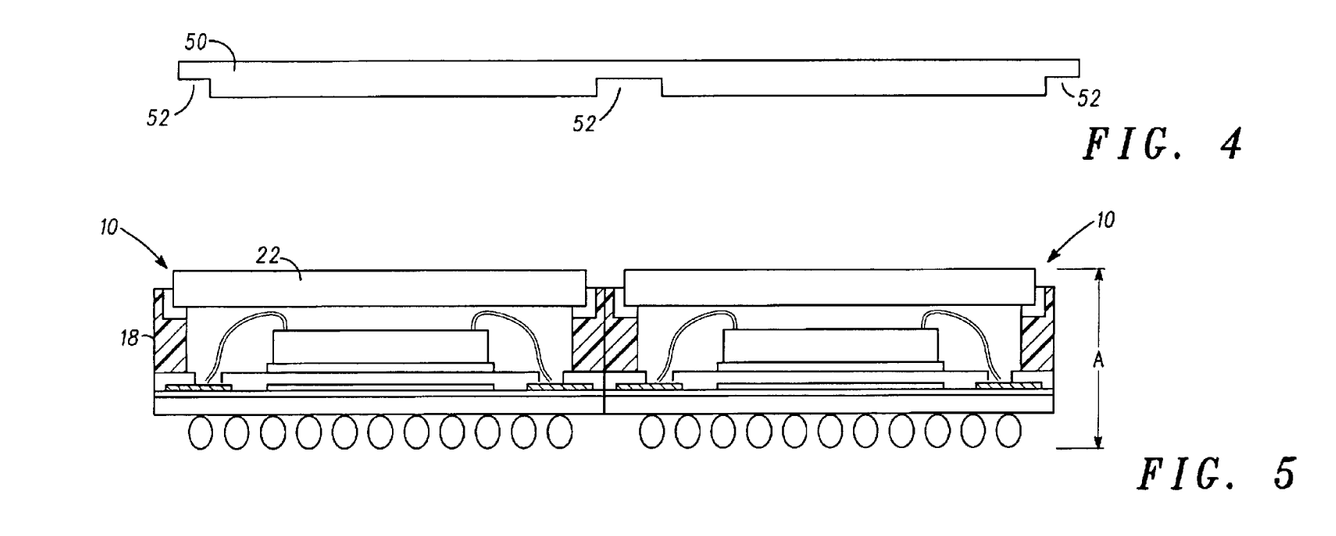
FIG. 4 is an enlarged side view of one embodiment of a transparent cover of an image sensor device of the present invention.
FIG. 5 is an enlarged cross-sectional view of two image sensor devices of FIG. 1 prior to singulation.
Figure 6:
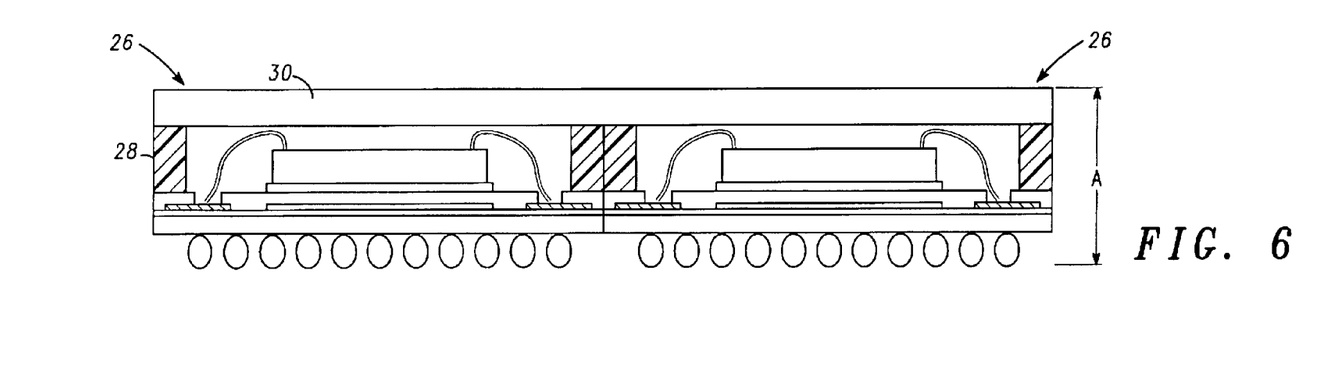
FIG. 6 is an enlarged cross-sectional view of two image sensor devices of FIG. 2 prior to singulation.

Referring now to FIG. 5, two of the devices 10 are shown prior to singulation. In this case, an adhesive, such as epoxy, is dispensed on the steps 20 or is preformed on the edges of the covers 22 prior to placing the covers 22 over the ICS 14. Similarly, FIG. 6 shows two of the devices 26 prior to singulation. Note that the cover 50 (FIG. 4) may be substituted for the cover 30 in FIG. 6. The grooves or channels etched or formed in the cover 50 aid in alignment of the cover 50. FIGS. 5 and 6 illustrate that multiple devices can be formed in parallel, as will be discussed in more detail below.

Figure 7:
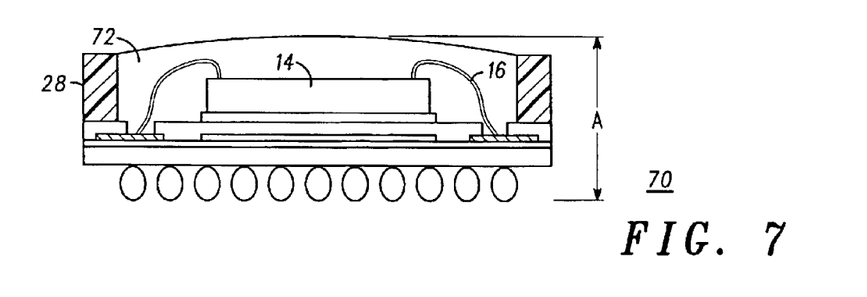
FIGS. 7–10 are enlarged, cross-sectional views of alternate embodiments of image sensor devices of the present invention.
Figure 9:
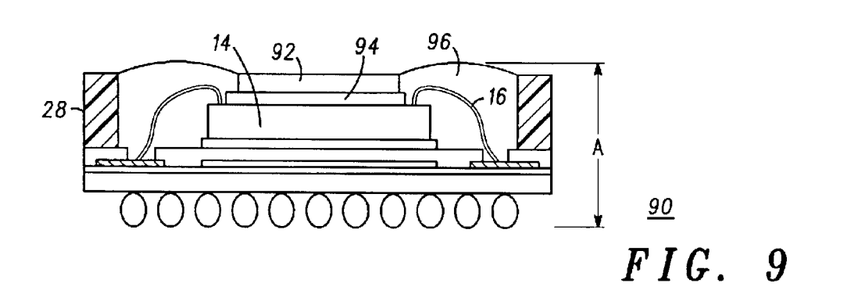
Figure 10:
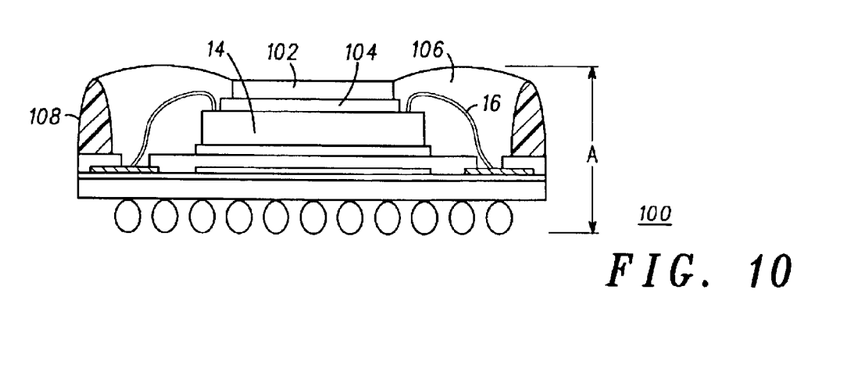

Referring now to FIGS. 7–10, alternate embodiments of image sensor devices of the present invention are shown. FIG. 7 shows an image sensor device 70 that is similar to the sensor device 26 shown in FIG. 2 except that the device 70 does not have the same cover 30. Rather than a glass cover, a cover 72 of the device 70 is formed of a clear material, such as epoxy, that is globbed over the IC 14 and wires 16, and within the wall 28 surrounding the IC 14 and wires 16. FIG. 8 shows an image sensor device 80 in which a cover 82 thereof comprises a clear material, such as epoxy, that is molded over the over the IC 14 and wires 16, and within a wall 84 surrounding the IC 14 and wires 16. The wall 84 is preferably shorter than the wall 28 of the devices 26 (FIG. 2) and 70 (FIG. 7). FIG. 9 shows an image sensor device 90 having a cover 92 that is attached over the active area of the IC 14, preferably with a clear adhesive 94. A clear material 96, such as epoxy, is then used to fill the area between the IC 14 and the wall 28, and cover the wires 16. The cover 92 preferably comprises glass and the clear adhesive 94 an epoxy. FIG. 10 shows an image sensor device 100 having a cover 102 that is attached over the active area of the IC 14, preferably with a clear adhesive 104. A clear material 106, such as epoxy, is then used to fill the area between the IC 14 and a wall 108, and cover the wires 16. The cover 102 preferably comprises glass and the clear adhesive 104 an epoxy. The wall 108 is this example is formed of a soft material, such as epoxy, that has been hardened, such as by curing. Each of the devices shown in FIGS. 7–10 has a height or thickness of less than 1.3 mm and preferably less than 1.0 mm.

Figure 11A:
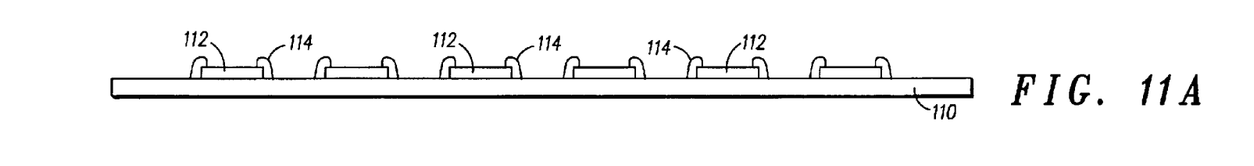
FIGS. 11A–11G are enlarged cross-sectional views illustrating the formation of image sensor devices of the present invention.

FIGS. 11A–11G, enlarged side views illustrating the steps of forming sensor devices in accordance with the present invention are shown. More particularly, FIGS. 11A–11G illustrate the capping of image sensor devices in the case where a vacuum or inert gas is used within the IC cavity. Referring now to FIG. 11A, a multi-layer circuit substrate 110 is provided. The substrate 110 includes a polyimide layer having a thickness of about 50 um, an adhesive layer having a thickness of about 12 um overlying a first side of the polyimide layer, a conductive metal trace layer having a thickness of between about 12 um to about 30 um overlying the adhesive layer, and a solder mask layer having a thickness of about 30 um overlying the conductive metal trace layer. A plurality of sensor integrated circuits (IC) 112 are attached to the circuit substrate 110 with a die attach adhesive at spaced intervals. Each of the integrated circuits 112 has a central, active area for receiving light and a peripheral bonding pad area including bonding pads. The integrated circuits 112 are electrically connected to the substrate 110 via wires 114, which are wirebonded to the bonding pads to the bonding pads on the integrated circuits and corresponding bonding pads on the substrate 110.

Figure 11B:
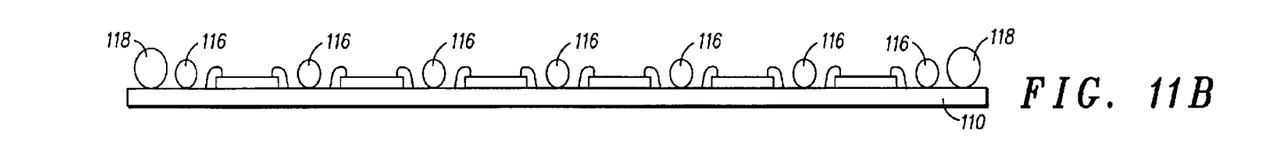

Referring now to FIG. 11B, a wall 116 is formed around each of the integrated circuits 112. The wall 116 may be formed by dispensing a dam material, such as an epoxy, a metal, or an organic material like BT, in a grid-like pattern such that each of the intergrated circuits 112 is surrounded by the wall 116. In the cases where the wall 116 is formed of metal or BT materials, the top surface of the wall 116 has a thin coat of suitable adhesive applied thereto. The thin coat of adhesive will hold the top glass plate and essentially seal the IC therein. An outer wall 118, which is larger (higher) than the wall 116 is then formed around the outer perimeter of the substrate 110 such that the outer wall 118 surrounds all of the integrated circuits 112, wires 114 and the wall 116. The outer wall 118 may be formed of a soft material such as dam epoxy.

Figure 11C:
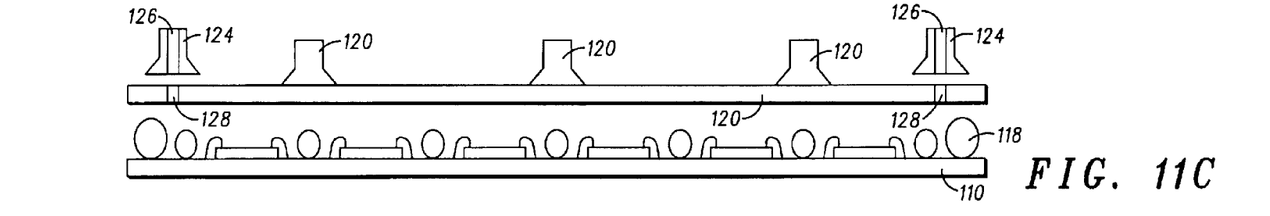

As shown in FIG. 11C, a transparent cover 120 is then placed over the integrated circuits 112 and wires 114, preferably using first suction pads 122 and second suction pads 124. The second suction pads 124 have a central bore or hole 126 that is aligned over a hole 128 in the transparent cover 120. The hole 128 in the cover 120 is aligned such that it is located just inside of the outer wall 118. The suction pads 122 may hold the cover 120 via vacuum force. While the cover 120 is being moved and placed over the integrated circuits 112, the suction pads 122 have a vacuum on and the suction pads 124 have a vacuum off. The cover 120 preferably comprises borosilicate glass having a thickness of less than about 0.4 mm.

Figure 11D:
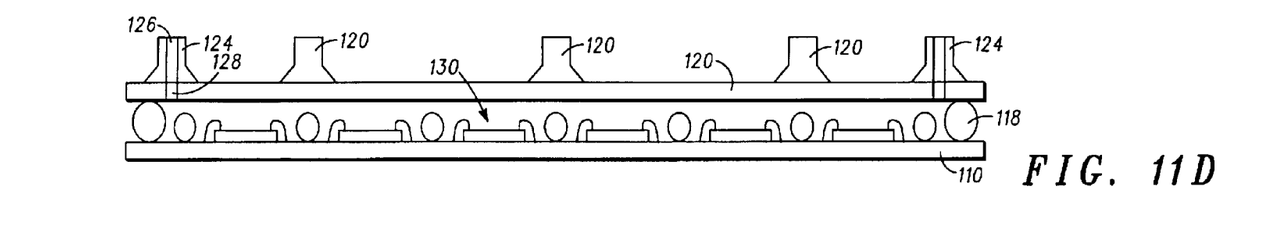
Figure 11E:
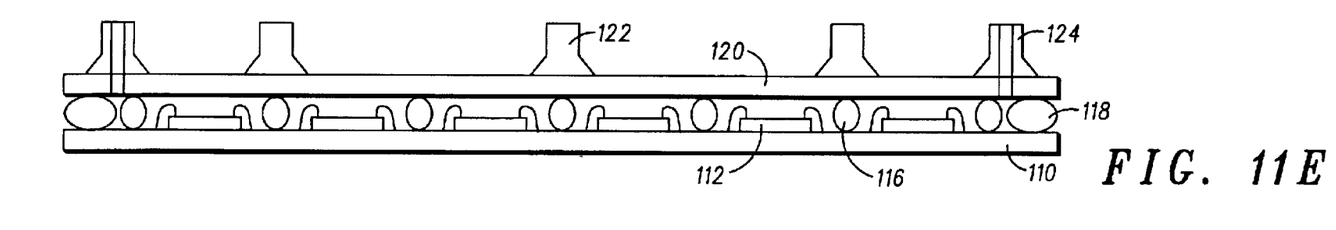
Figure 11F:
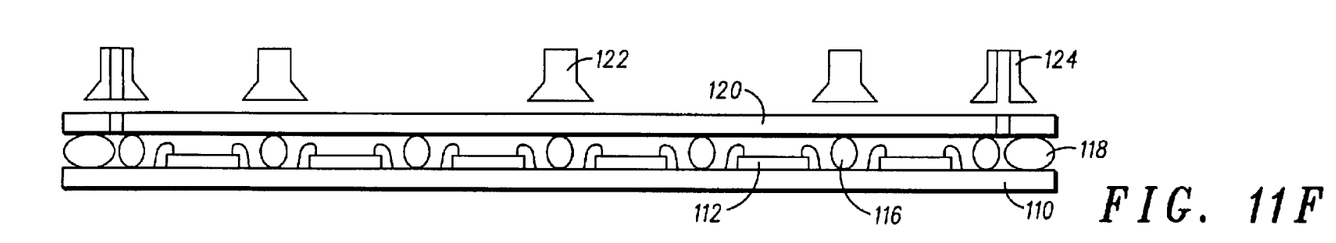
Figure 11G:
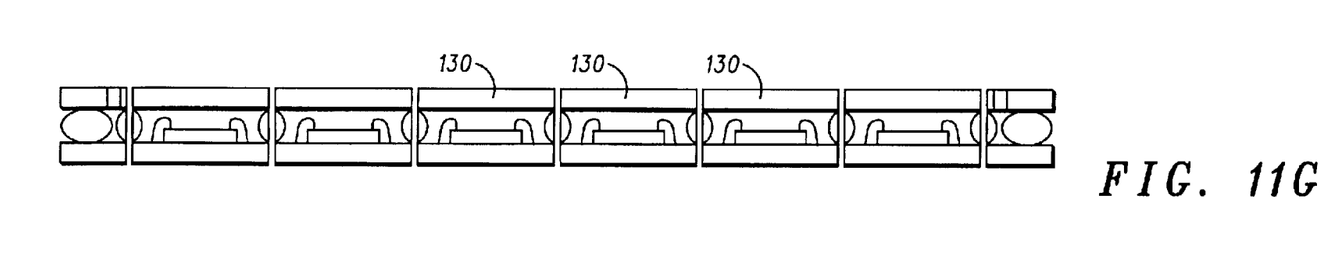

Referring to FIG. 11D, the cover 120 is pressed into contact with the outer wall 118. After the cover 120 contacts the outer wall 118, a suction or vacuum force is applied to the second suction pads 124 such that air is removed from the space 130 formed by the substrate 110, the outer wall 118, and the cover 120 via the holes 126 and 126. In one embodiment of the invention, after vacuuming air out of the space 130, the space 130 is filled with an inert gas by way of the holes 126 and 128. As shown in FIG. 11E, the cover 120 is then pressed into contact with the wall 116, such that the cover 120 is attached to the wall 116. FIG. 11F shows the vacuum forces being turned off such that the cover 120 is released by the suction pads 122 and 124, and FIG. 11G shows a step of singulating the covered integrated circuits by sawing along the wall 116, thereby forming individual image sensor devices 130. Either before or after the singulation step, solder balls (not shown) may be attached to the underside of the substrate 110. The finished devices have a height of less than about 1.3 mm, and preferably less than about 1.0 mm.

As can be seen, the present invention provides an image sensor device with a very low package height. The structure of the device provides for a very short optical path and thus, very low diffraction. The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

What is claimed is:

1. An image sensor device, comprising:
    a flexible circuit substrate having first and second opposing sides, the first side having a central area and an outer, bonding pad area including bonding pads;
    a sensor integrated circuit (IC) attached to the central area of the first side of the circuit substrate, the IC having an active area and a peripheral bonding pad area, the peripheral bonding pad area including bonding pads;
    a plurality of wires wirebonded to respective ones of the IC bonding pads and corresponding ones of the circuit substrate bonding pads, thereby electrically connecting the IC and the circuit substrate;
    a wall having a first end and a second end, the second end attached to an outer portion beyond the outer bonding pad area of the first side of the flexible circuit substrate, wherein the wall at least partially surrounds the sensor integrated circuit; and
    a transparent cover located above the sensor integrated circuit such that light can pass through the cover onto the IC active area, wherein the cover has a top side and a bottom side with channels formed at edges thereof, wherein at least a portion of a top surface of the wall is received within said channels.

2. The image sensor device of claim 1, further comprising solder balls attached to the second side of the circuit substrate, wherein the circuit substrate provides for electrical interconnect between the solder balls and the bonding pads on the first side of the circuit substrate.

3. The image sensor device of claim 2, wherein the solder balls have a height of less than about 400 um.

4. The image sensor device of claim 2, wherein the image sensor device has a thickness of less than about 1.3 mm.

5. The image sensor device of claim 2, wherein the image sensor device has a thickness of less than about 1.0 mm.

6. The image sensor device of claim 1, wherein the wall is formed of a metal.

7. The image sensor device of claim 1, wherein the wall is formed of BT.

8. The image sensor device of claim 1, wherein the transparent cover comprises borosilicate glass having a thickness of less than 0.4 mm.

9. The image sensor device of claim 1, wherein the IC is attached to the circuit substrate with an adhesive layer having a thickness of about 12 um.

10. The image sensor device of claim 1, wherein the circuit substrate comprises:
    a polyimide layer having top and bottom surfaces;
    an adhesive layer overlying the top surface of the polyimide layer;
    a conductive trace layer overlying the adhesive layer; and
    a mask layer overlying the conductive trace layer, wherein a top surface of the mask layer forms the first side of the circuit substrate and the bottom surface of the polyimide layer forms the second side of the circuit substrate.

11. The image sensor device of claim 10, wherein the adhesive layer has a thickness of about 12 um.

12. The image sensor device of claim 11, wherein the mask layer has a thickness of about 30 um and the conductive trace layer has a thickness of between about 12 um to about 30 um.

13. The image sensor device of claim 12, wherein the polyimide layer has a thickness of about 50 um.

14. The image sensor device of claim 13, wherein the conductive layer is formed of copper and the mask layer comprises a solder mask.

15. An image sensor device, comprising:
    a flexible circuit substrate having first and second opposing sides, the first side having a central area and an outer, bonding pad area including bonding pads;
    a sensor integrated circuit (IC) attached to the central area of the first side of the circuit substrate, the IC having an active area and a peripheral bonding pad area, the peripheral bonding pad area including bonding pads;

a plurality of wires wirebonded to respective ones of the IC bonding pads and corresponding ones of the circuit substrate bonding pads, thereby electrically connecting the IC and the circuit substrate;

a wall having a first end and a second end, the second end attached to an outer portion beyond the outer bonding pad area of the first side of the flexible circuit substrate, wherein the wall at least partially surrounds the sensor integrated circuit;

a transparent cover comprising borosilicate glass attached to the IC with a clear adhesive; and a clear epoxy disposed between the glass and the wall, wherein the epoxy covers the wires.

16. The image sensor device of claim 15, wherein the wall is formed with soft epoxy.

* * * * *